United States Patent [19]
Ichitani et al.

[11] Patent Number: 6,120,301
[45] Date of Patent: *Sep. 19, 2000

[54] SEMICONDUCTOR DEVICE AND METHOD OF MANUFACTURING THE SAME

[75] Inventors: Masahiro Ichitani, Koganei; Ryo Haruta, Kodaira; Katsuyuki Matsumoto, Hitachi; Arata Kinjyo, Tachikawa; Tsutomu Kakimoto, Komoro, all of Japan

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/686,503

[22] Filed: Jul. 24, 1996

[30] Foreign Application Priority Data

Aug. 17, 1995 [JP] Japan ................................. 7-231968

[51] Int. Cl.[7] .................................................. H01L 21/20
[52] U.S. Cl. .......................... 437/108; 438/112; 438/123; 438/126; 438/108
[58] Field of Search .................................. 438/112, 123, 438/126, 108, 109, 115, FOR 370

[56] References Cited

U.S. PATENT DOCUMENTS

| | | |
|---|---|---|
| 3,909,838 | 9/1975 | Beyerlein . |
| 4,413,309 | 11/1983 | Takahashi et al. . |
| 4,658,010 | 4/1987 | Long et al. . |
| 5,148,165 | 9/1992 | Phillips . |
| 5,216,278 | 6/1993 | Lin et al. . |
| 5,256,598 | 10/1993 | Farnworth et al. . |
| 5,262,279 | 11/1993 | Tsang et al. . |
| 5,286,679 | 2/1994 | Farnworth et al. . |
| 5,457,071 | 10/1995 | Dombroski . |
| 5,569,960 | 10/1996 | Kumazawa et al. . |
| 5,608,262 | 3/1997 | Degani et al. . |
| 5,629,835 | 5/1997 | Mahulikar et al. . |
| 5,633,529 | 5/1997 | Otsuki . |
| 5,650,593 | 7/1997 | McMillan et al. . |
| 5,677,566 | 10/1997 | King et al. . |
| 5,696,033 | 12/1997 | Kinsman . |
| 5,724,232 | 3/1998 | Bhatt et al. . |
| 5,732,465 | 3/1998 | Tokita et al. . |
| 5,747,101 | 5/1998 | Booth et al. . |
| 5,786,986 | 7/1998 | Bregman et al. . |

OTHER PUBLICATIONS

VLSI Packaging Technology, vol. II, published by Nikkei BP Co., May 31, 1993, pp. 173–178, with English translation.

Gain No. 107, 1994.11, pp. 6–8, with English translation.

*Primary Examiner*—David E. Graybill
*Attorney, Agent, or Firm*—Mattingly, Stanger & Malur

[57] ABSTRACT

In the BGA in which the bonding portions of the support frame bonded to the wiring substrate via adhesive layer are molded by a resin, the areas of the bonding portions are each selected to be from 0.5 to 3.1 mm$^2$. Furthermore, holes are formed in the substrate under the frame corresponding to the bonding portions.

6 Claims, 13 Drawing Sheets

SEMICONDUCTOR DEVICE AND METHOD OF MANUFACTURING THE SAME

BACKGROUND OF THE INVENTION

The present invention relates to technology for manufacturing semiconductor devices and, particularly, to technology for manufacturing semiconductor devices in which a semiconductor pellet is mounted on one main surface of a wiring substrate and is sealed with a resin. The semiconductor devices have many pins are small in size and are cheaply constructed.

In modern packages having an increasingly large number of pins and in which leads are taken out from the peripheries thereof as represented by quad flat packages (QFP) and tape carrier packages (TCP), there is a tendency to shorten the pitch among the leads. However, this imposes a limitation on the production of packages by machining lead frames. In order to cope with this problem, there has been proposed a ball grid array (hereinafter referred to as BGA) which is a surface mount-type package having external terminals disposed on the entire main surface of the package enabling the number of pins to be increased without increasing the size of the package.

The BGA is provided with a wiring substrate having a plurality of electrodes which are formed on the front surface and on the back surface thereof and are electrically connected to each other. A semiconductor pellet is bonded to the front surface of the wiring substrate, the electrodes on the front surface of the wiring substrate and external terminals (pads) of the pellet are electrically connected together via wires that are bonded thereto, and the semiconductor pellet, bonded wires and the electrodes on the front surface are molded with a resin. On the back surface of the wiring board are further formed solder bump electrodes.

The BGA has been disclosed in, for example, "VLSI Packaging Technology (Vol. II)" published by Nikkei BP Co., May 31, 1993, pp. 173–178, U.S. Pat. No. 5,216,278 and U.S. Pat. No. 5,148,165.

SUMMARY OF THE INVENTION

The conventional BGA, however, experiences difficulty in positioning the wiring substrate in a metal mold of a transfer molding machine that produces resin-molded products, resulting in an increase in the cost of manufacturing the BGA. In order to easily and correctly position the wiring substrate in the metal mold, therefore, production technology has been proposed according to which the wiring substrate is supported by a support frame which is then positioned in the metal mold.

However, when the wiring substrate is simply bonded to the support frame using an adhesive in order to support the wiring substrate by the support frame, it is likely that an excess of stress acts upon the bonding regions when a thermal stress is given thereto.

It is therefore an object of the present invention to provide a semiconductor device which is capable of preventing or suppressing stress from occurring in the regions where the wiring substrate is bonded to the support frame.

Another object of the present invention is to provide a method of manufacturing a semiconductor device without increasing the cost of production.

The above-mentioned objects as well as novel features of the present invention will become obvious from the description of the specification and the accompanying drawings.

Described below briefly is a representative example of the invention disclosed in this application.

That is, the present invention is concerned with a semiconductor device in which a semiconductor pellet is mounted on a main surface of the wiring substrate, external terminals of the semiconductor pellet are electrically connected to the electrodes formed on one main surface of the wiring substrate, the semiconductor pellet is molded with a resin, and bump electrodes are formed on the surface opposite to the main surface of the wiring substrate, wherein the main surface of the wiring substrate is supported by being bonded to a frame at a plurality of portions thereof, and the area of each bonding portion is not smaller than 0.5 mm$^2$ but is not larger than 3.1 mm$^2$.

The wiring substrate is bonded to the frame using a thermoplastic adhesive having a glass transition temperature of not lower than 200° C. and a melt viscosity at higher than 350° C. of not larger than 10$^5$ poises. After the adhesive is applied and is pre-dried, the adhesive portions are bonded to the wiring substrate by thermocompression, whereby an adhesive layer is formed. Moreover, the adhesive is pre-dried in a manner that the amount of the solvent remaining in the adhesive after pre-drying is from 0.1% to 10% on the weight basis, and the thermocompression bonding is carried out at a temperature of not higher than 300° C. for not longer than 5 seconds.

According to the above-mentioned means, the bonding portions are so small that only very small stress is produced by the thermal stress. As a result, even in case a gap may be formed in the molded resin, no crack occurs starting from the bonding portions of the wiring substrate.

According to the above-mentioned means which uses a thermoplastic adhesive having a very high viscosity, furthermore, the adhesive portions of the anchor are easily bonded to the wiring substrate. Besides, the content of the solvent in the thermoplastic adhesive has been reduced down to a predetermined value due to pre-drying, enabling the adhesive to be accomplished at a decreased temperature and suppressing adverse effects upon the wiring substrate or the semiconductor pellet during the bonding operation.

BRIEF DESCRIPTION OF THE DRAWINGS

FIG. 1 illustrates a BGA according to an embodiment of the present invention, wherein

FIG. 2 illustrates one of a series of support frames used for the method of manufacturing the BGA according to an embodiment of the present invention, wherein

FIG. 4 illustrates a wiring substrate used for the manufacturing method, wherein

FIG. 5 illustrates a combination of the support frame and the wiring substrate after a step of combination in the manufacturing method, wherein

FIG. 6 illustrates a step of combining the wiring substrate and the support frame, wherein

FIG. 9 is a diagram illustrating a state after the pellet-bonding and wire-bonding steps, wherein

FIG. 11 is a diagram illustrating a state after the resin is molded, wherein

FIG. 13 illustrates the BGA according to a second embodiment of the present invention, wherein

DESCRIPTION OF THE PREFERRED EMBODIMENTS

Figure 1A:
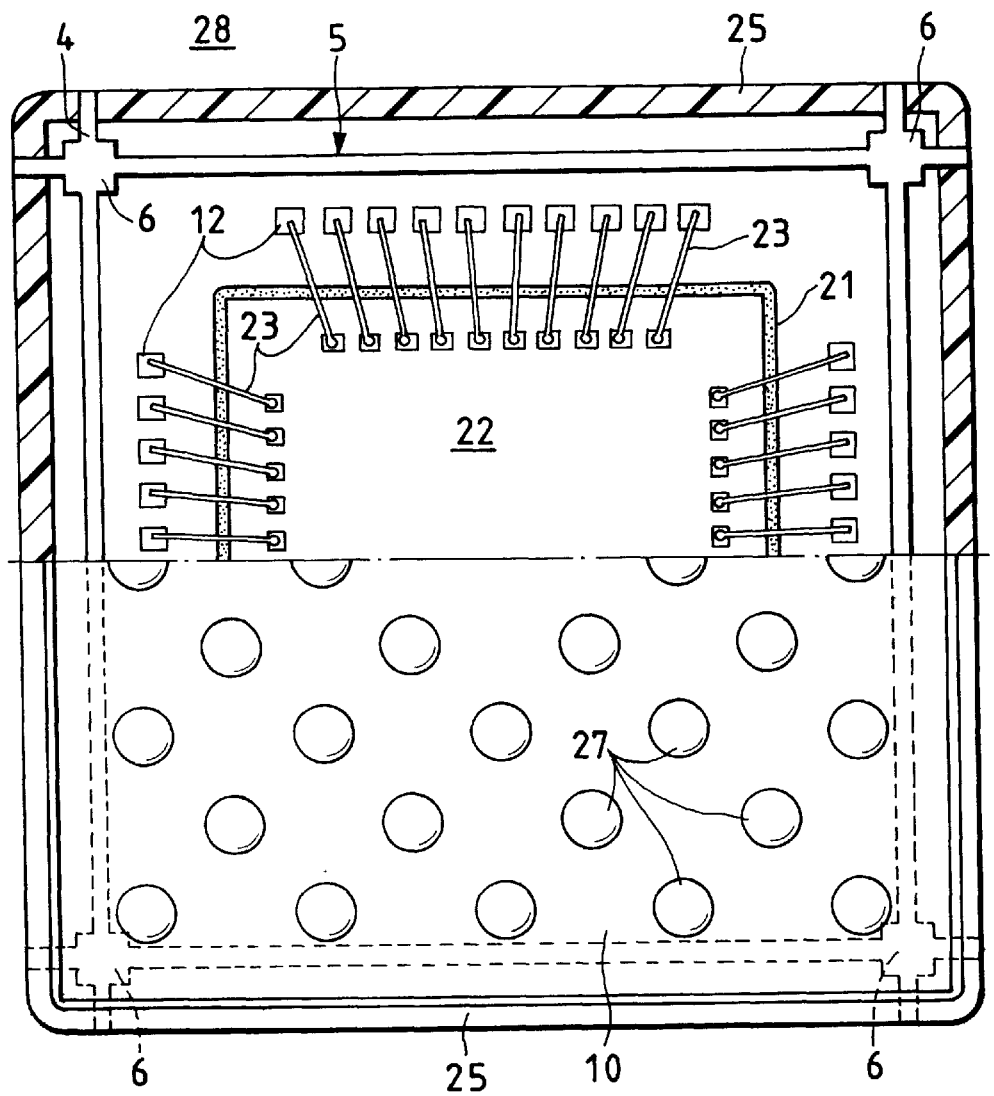
FIG. 1(a) is a diagram of which the upper half side is a sectional plan view thereof and the lower half side is a bottom view.
Figure 1B:
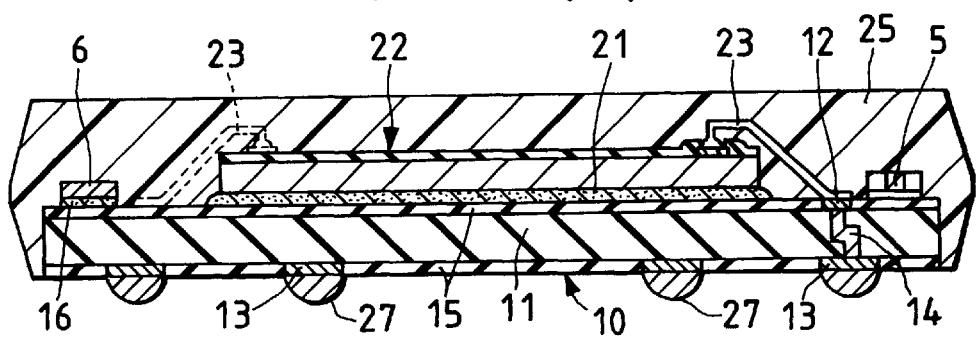
FIG. 1(b) is a front sectional view thereof.
Figure 2A:
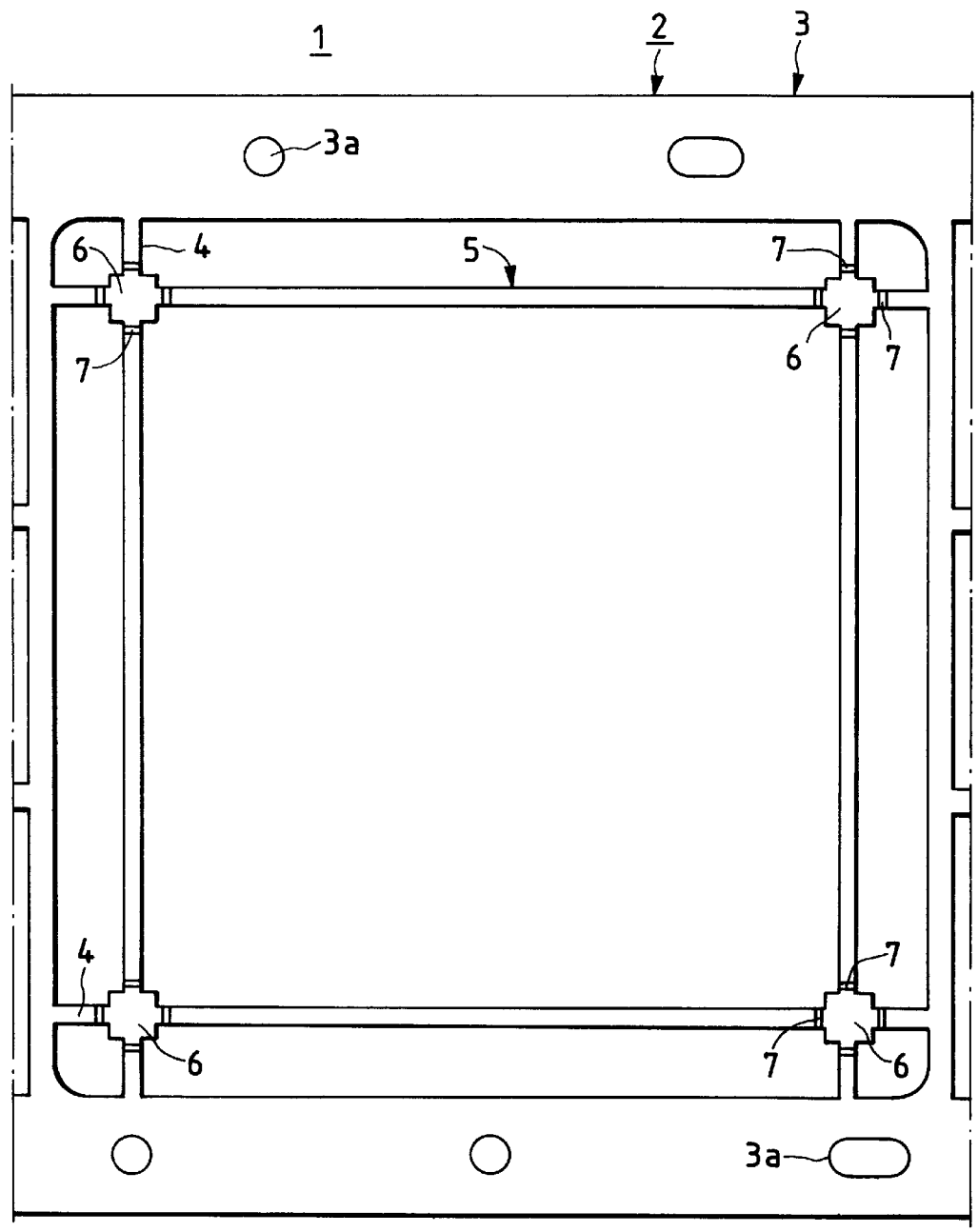
FIG. 2(a) is a partly omitted plan view thereof and FIG. 2(b) is a front sectional view thereof.
Figure 2B:

FIG. 1 illustrates a BGA according to an embodiment of the present invention, wherein FIG. 1(a) is a diagram of which the upper half side is a sectional plan view thereof and the lower half side is a bottom view thereof, and FIG. 1(b) is a front sectional view thereof. FIG. 2 and the subsequent figures are the drawings for explaining a method of manufacturing the BGA according to an embodiment of the present invention.

In the embodiment of the present invention, the semiconductor device is constituted in the form of a BGA 28 which is a semiconductor integrated circuit device having an increased number of pins and featuring small size and low cost. The BGA 28 is constituted as shown in FIG. 1.

The BGA 28 is equipped with a wiring substrate 10 that has a group of internal terminals 12 and a group of external terminals 13 that are formed on the front main surface and on the back main surface, respectively, the internal terminals 12 and the external terminals 13 being electrically connected together through electric wirings 14 penetrating through the base 11 of the wiring substrate 10. A semiconductor pellet (hereinafter referred to as pellet) 22 in which is fabricated a semiconductor integrated circuit inclusive of a group of semiconductor elements, is mounted (bonded) via a bonding layer 21 onto a central portion on the upper surface of the base 11 of the wiring substrate 10 which is the main surface on the side of the internal terminals 12 of the wiring substrate 10, the pellet 22 being so mounted that its surface is faced upwards. The main surface of the side opposite to the bonded surface of the pellet 22 is surrounded by a plurality of electrode pads that are formed along the outer peripheral portion thereof, the electrode pads being connected to the internal terminals 12 of the wiring substrate 10 through wires 23. An anchor 5 is opposed to the main surface of the wiring substrate 10 on the side of the pellet and is bonded to a plurality of bonding portions 6 via an bonding layer 16 that is formed by using a thermoplastic adhesive that will be described later. The areas of the bonding portions 6 are each about 1.4 mm$^2$. On the main surface and side surfaces of the wiring substrate 10 on the side of the pellet is molded a resin 25 so as to seal therein the pellet 22, group of internal terminals 12, group of wires 23 and anchor 5. Solder bumps 27 are formed protruding on the external terminals 13 that are exposed on the main surface of the opposite side of the wiring substrate 10. The BGA 28 is manufactured by a method explained below.

That is, described below is the method of manufacturing the BGA according to an embodiment of the present invention.

According to this embodiment, the BGA is manufactured by using one of a series of support frames 1 shown in FIG. 2. The series of support frames 1 are made of a thin plate of a material having good heat conductivity, such as copper-type material (copper or copper alloy) or steel-type material (steel or alloy thereof), and are formed as a unitary structure by a suitable means such as punching press work or etching. The series of support frames 1 are constituted by a plurality of unit support frames (hereinafter referred to as support frames) 2 which are arranged in a row in the transverse direction. The series of support frames 1 consist of a repetition of a pattern between dot-dash chain lines of FIG. 2. Therefore, only one unit is described and diagramed.

The support frame 2 is equipped with an outer frame 3 assembled in a square shape using a top rail, a bottom rail and a pair of side rails. The inner shape of the outer frame 3 as viewed on a plane corresponds to the outer shape of the resin mold 38 as viewed on a plane. The outer frame 3 makes it possible to substantially constitute a dam during the transfer molding that will be described later. A pilot hole 3a is formed in the top rail and in the bottom rail of the outer frame 3.

Figure 3A:
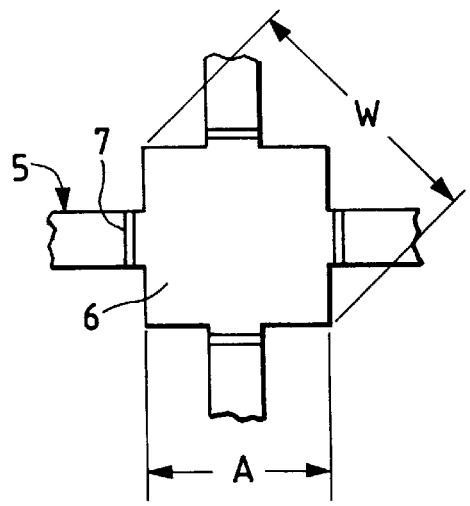
FIG. 3(a) is a plan view illustrating a bonding portion of the support frame on an enlarged scale.
Figure 3B:
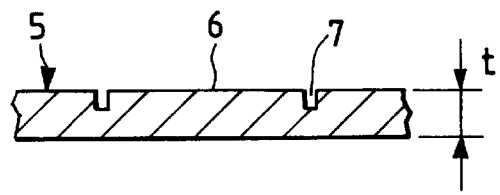
FIG. 3(b) is a front sectional view thereof.

Inside the outer frame 3, the anchor 5 is disposed in concentric therewith and is hanged by hanging members 4, the anchor 5 being formed in the shape of a square frame which is smaller than the outer frame 3 but is larger than the pellet. A bonding portion 6 of a small square flat plate-like shape is disposed at four corners of the anchor 5 of the shape of a square frame in concentric therewith. The bonding portion 6 has an area which is not larger than 3.1 mm$^2$ but is not smaller than 0.5 mm$^2$. In this embodiment, the bonding portion of a square shape as shown in FIG. 3(a) has a width A of 1.2 mm and an area of about 1.4 mm$^2$ by taking the manufacturing error into consideration. Here, the support frame 2 has a thickness t of about 0.2 mm. As shown in FIGS. 3(a) and 3(b), furthermore, adhesive overflow-preventing grooves 7 are formed in four sides near the bonding portions 6 on one main surface of the anchor 5, the adhesive overflow-preventing grooves extending in parallel with each of the sides and having a predetermined width and a predetermined depth.

Figure 3C:
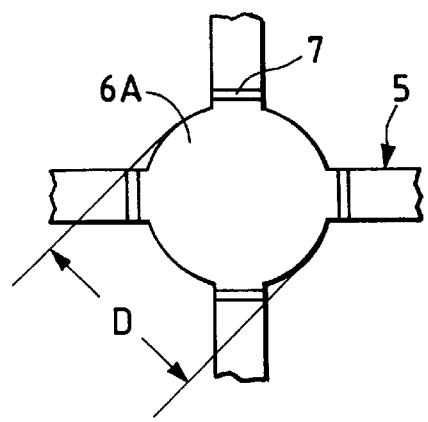
FIG. 3(c) is a plan view illustrating the bonding portion of a modified example on an enlarged scale.
Figure 3D:
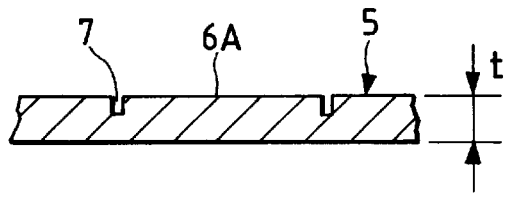
FIG. 3(d) is a front sectional view thereof.

The bonding portions are in no way limited to the square flat plate-like shape but may be formed in a circular flat plate shape as shown in FIGS. 3(c) and 3(d). The diameter D of the circular bonding portion 6A that is diagrams has been set to be not larger than 2 mm.

Figure 4A:
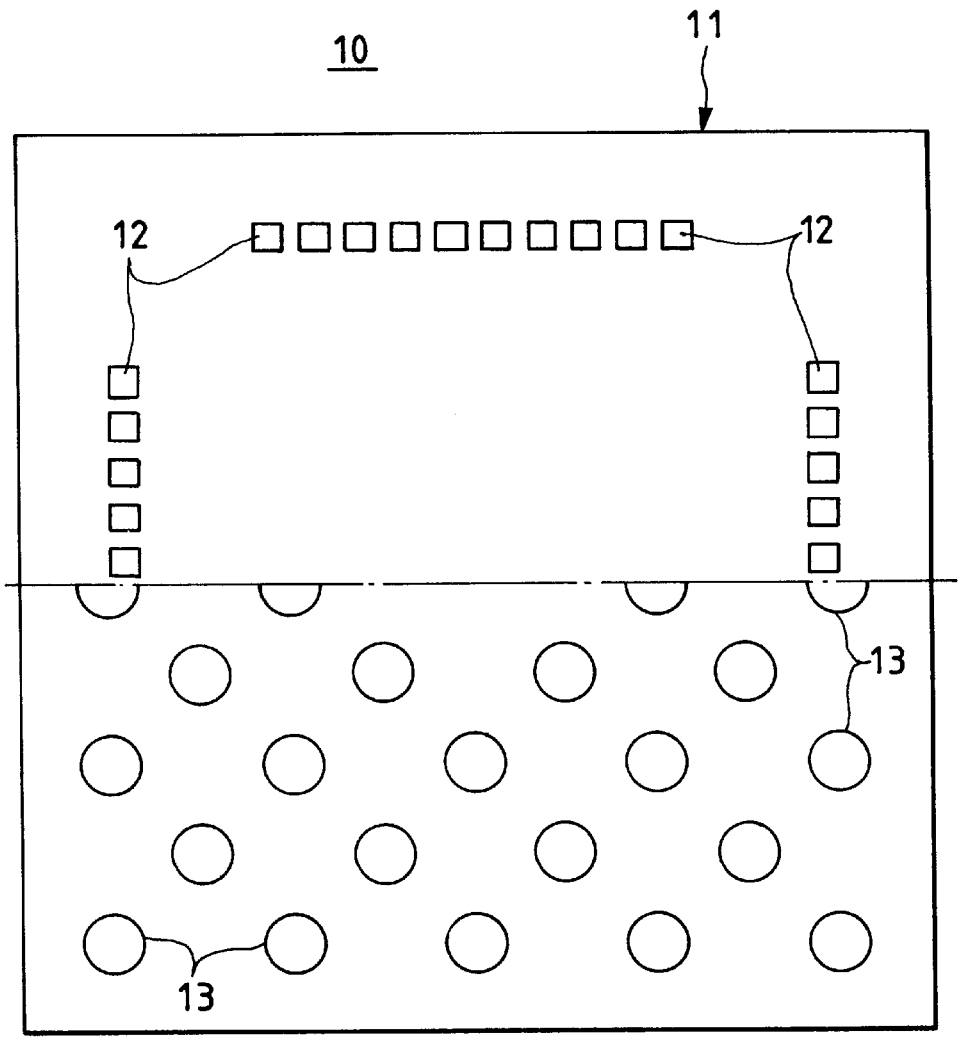
FIG. 4(a) is a diagram of which the upper half side is a plan view and the lower half side is a bottom view.
Figure 4B:
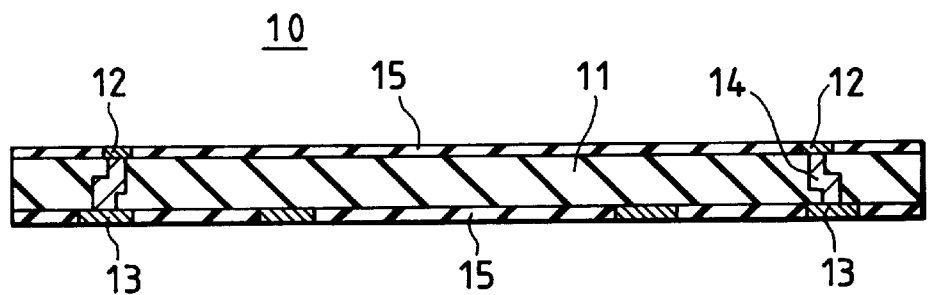
FIG. 4(b) is a partly cut-away front view.

According to this embodiment, the BGA is manufactured by using a wiring substrate 10 shown in FIG. 4. The wiring substrate 10 is equipped with a base 11 having electrically insulating property and a square flat plate-like shape. The base 11 has an outer diameter which is larger than the outer diameter of the pellet but is smaller than the outer diameter of the resin mold. In this embodiment, the base 11 is formed in a multi-layer structure (not shown) using a glass-epoxy resin obtained by impregnating a glass fiber with an epoxy resin. Here, however, the base 11 can be formed by using an insulating substrate such as of ceramics, etc.

Onto one main surface (hereinafter referred to as upper surface) of the base 11 are attached internal terminals 12 formed in the shape of a small square thin plate (corresponding to the number of electrode pads of the pellet) being aligned along a square outer line. Onto the lower surface of the base 11 are attached external terminals 13 formed in the shape of a small circular thin plate in a number corresponding to the internal terminals 12; being uniformly dispersed over the whole square surface. In this embodiment, the group of internal terminals 12 and the group of external terminals 13 are formed by patterning a copper foil deposited on the surface of the base 11 relying upon the lithography processing and etching processing. Here, however, the internal terminals 12 and the external terminals 13 can be formed by the screen-printing method, plating method, or vapor deposition method using a metal mask.

The internal terminals 12 arranged on the upper surface of the base 11 are electrically isolated from each other and the external terminals 13 arranged on the lower surface of the base 11 are electrically isolated from each other. The internal terminals 12 and the external terminals 13, however, are electrically connected together through the electric wires 14. A number of electric wires 14 that are electrically insulated from each other are patterned in each of the layers of the base 11 formed in a multi-layer structure, the upper layers and the lower layers being connected together through holes thereby to constitute a so-called multi-layer wiring structure.

In this embodiment, protection films 15 called solder resist are deposited on the upper surface and on the lower surface of the base 11, and the internal terminals 12 on the upper surface and the external terminals 13 on the lower surface are exposed from the protection films 15.

Figure 5A:
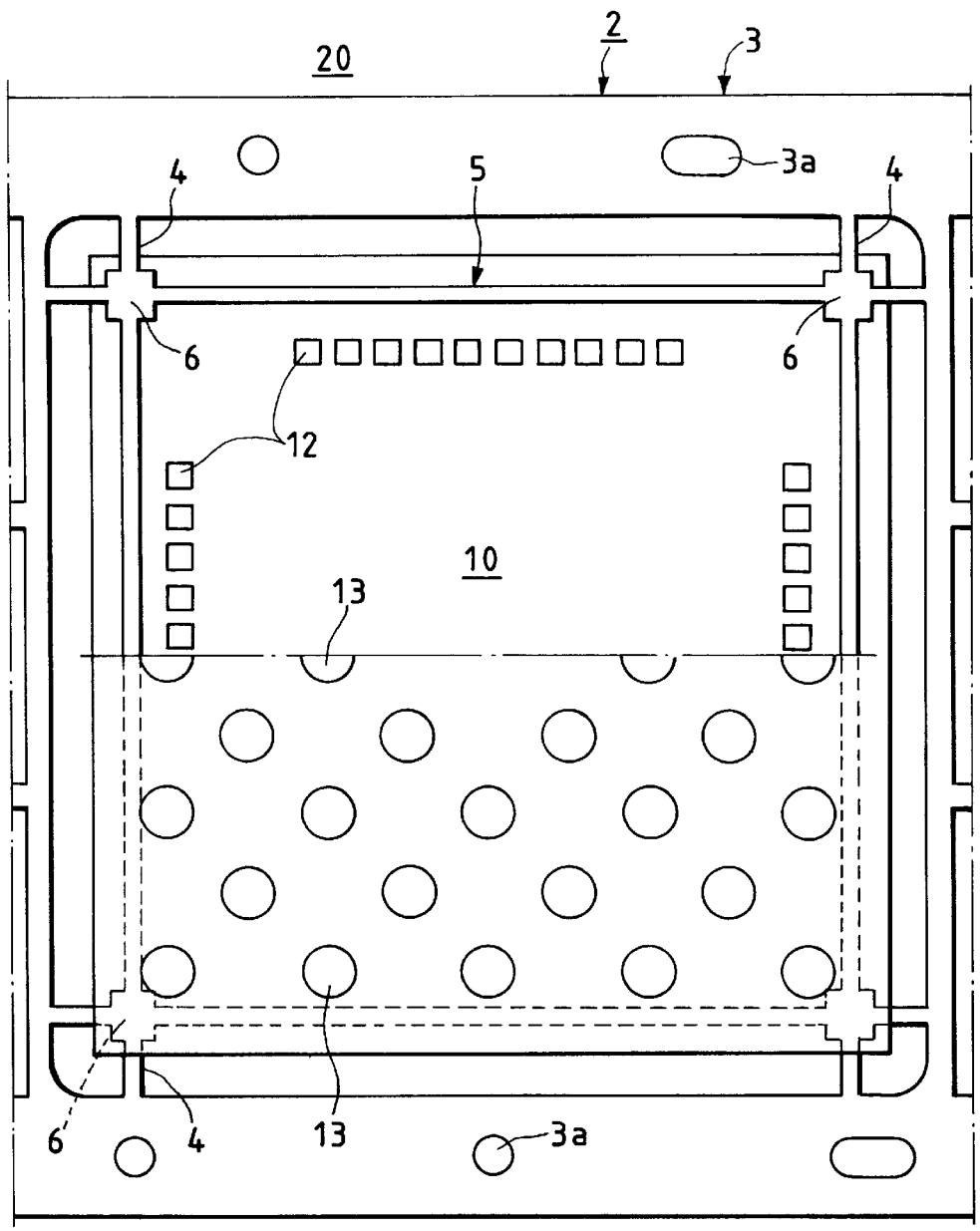
FIG. 5(a) is a diagram of which the upper half side is a plan view and the lower half side is a bottom view.
Figure 5B:
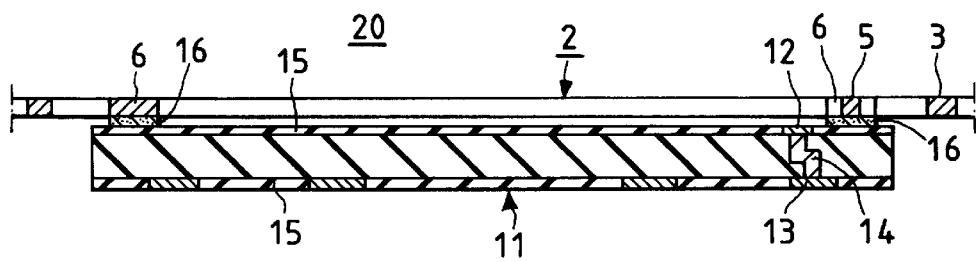
FIG. 5(b) is a front sectional view.

The thus constituted wiring substrate 10 is placed and mounted on the support frame 2 of one of a series of support frames 1 piece by piece as shown in FIG. 5. That is, after the adhesive is applied to the bonding portions 6 of the anchor 5 of the support frame 2, the wiring substrate 10 is so placed on the support frame 2 that the inner positions at the four corners thereof are brought into match with the bonding portions 6 of the anchor 5. As the adhesive cures in a state where the wiring substrate 10 is placed on the support frame 2, the wiring substrate 10 is bonded to the anchor 5 of the support frame 2 via the adhesive layer 16. In a combination 20 in which the support frame 2 and the wiring substrate 10 are coupled together in the vertical direction, the anchor 5 in the upper support frame 2 is attached to the base 11 via the adhesive layer 16 at four plates in a state in which the anchor 5 is superposed on, and slightly biting into, the outer peripheral edges of the base 11 of the lower wiring substrate 10 as viewed from the upper side. The operation for applying the adhesive, operation for mounting the wiring substrate and operation for curing the adhesive can be simultaneously executed for a plurality of support frames 2 and for the wiring substrates 10, enabling the operations to be carried out very efficiently.

The step for combining the wiring substrate and the support frame together will now be described in detail.

Figure 6A:
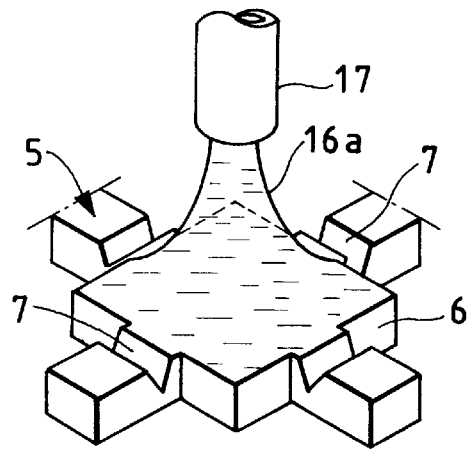
FIG. 6(a) is a perspective view illustrating part of a coating step on an enlarged scale.

Referring, first, to FIG. 6(a), an adhesive 16a is applied using a syringe 17 to the main surface (main surface of the side to be adhered) of the bonding portion 6. The adhesive may be a thermoplastic adhesive having a glass transition temperature of not lower than 200° C. and a melt viscosity at 350° C. of $10^4$ to $10^5$ poises, such as a polyimide-type thermoplastic adhesive like polyether amide imide. Though the adhesive 16a applied to the bonding portion 6 has a high viscosity and seldom overflows out of the bonding portion 6, the adhesive overflow-preventing grooves 7 work to reliably prevent the adhesive 16a that is applied from overflowing.

Figure 6B:
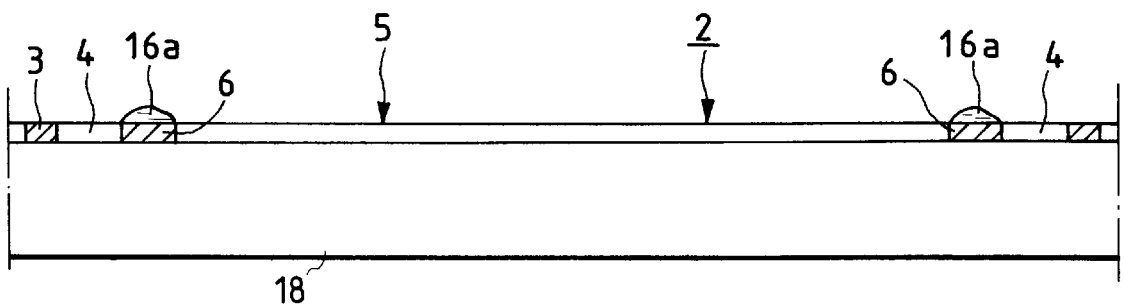
FIG. 6(b) is a front sectional view illustrating a pre-drying step.

Referring to FIG. 6(b), the adhesive 16a applied to the bonding portion 6 is heated by a heat block 18 to vaporize the solvent and is thus pre-dried. Here, the adhesive 16a is dried to such a degree that the remaining amount of the solvent is from 0.1% to 10% by weight. The solvent may be, for example, an n-methyl pyrrolidone. It is desired that the step of pre-drying is executed at a temperature of 250° C. for about 60 seconds.

Figure 6C:
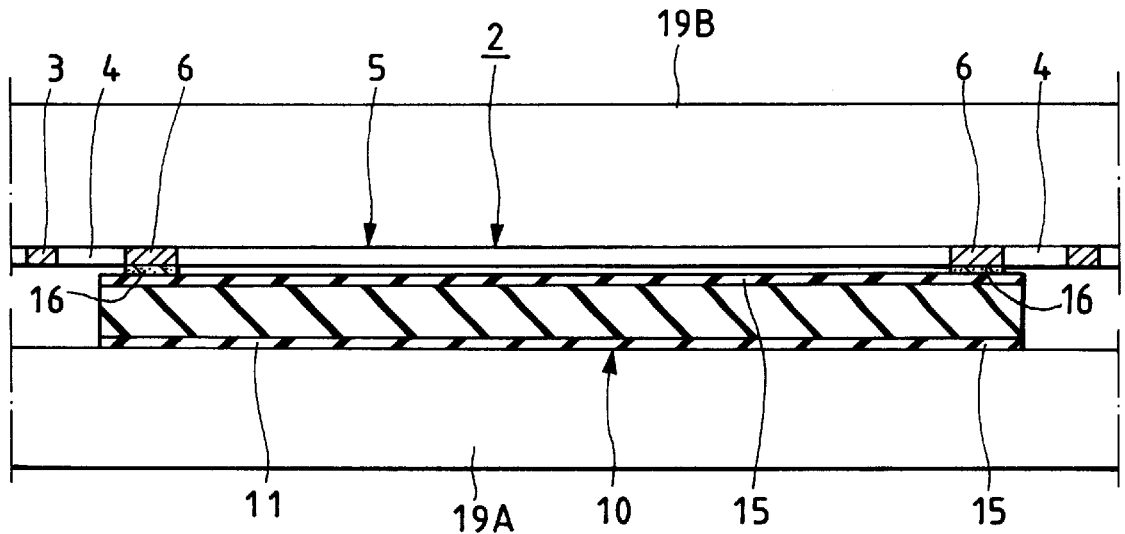
FIG. 6(c) is a front sectional view illustrating a step of thermocompression bonding.

Referring to FIG. 6(c), the wiring substrate 10 is bonded by thermocompression onto the support frame 2 on which the adhesive 16a at the pre-dried bonding portions 6. That is, on the lower heat block 19A is placed the wiring substrate 10 with its main surface of the side of internal terminals faced upwards. On the wiring substrate 10 is placed the support frame 2 with the four corners and the bonding portions 6 being in match with each other. Then, the adhesive 16a is heated while the upper heat block 19B is being pushed onto the support frame 2. The step of thermocompression bonding is effected at a temperature of not higher than 300° C. with the pushing force of [4 kgf/wiring substrate (4 kg per a piece of wiring substrate)] for about one second. Due to the thermocompression bonding, an adhesive layer 16 having a predetermined shearing strength is formed between the protective film 15 of the wiring substrate 10 and the bonding portions 6. The bonding is carried out below 300° C., so that the substrate is prevented from undergoing thermal deformation or discoloration.

Figure 7:
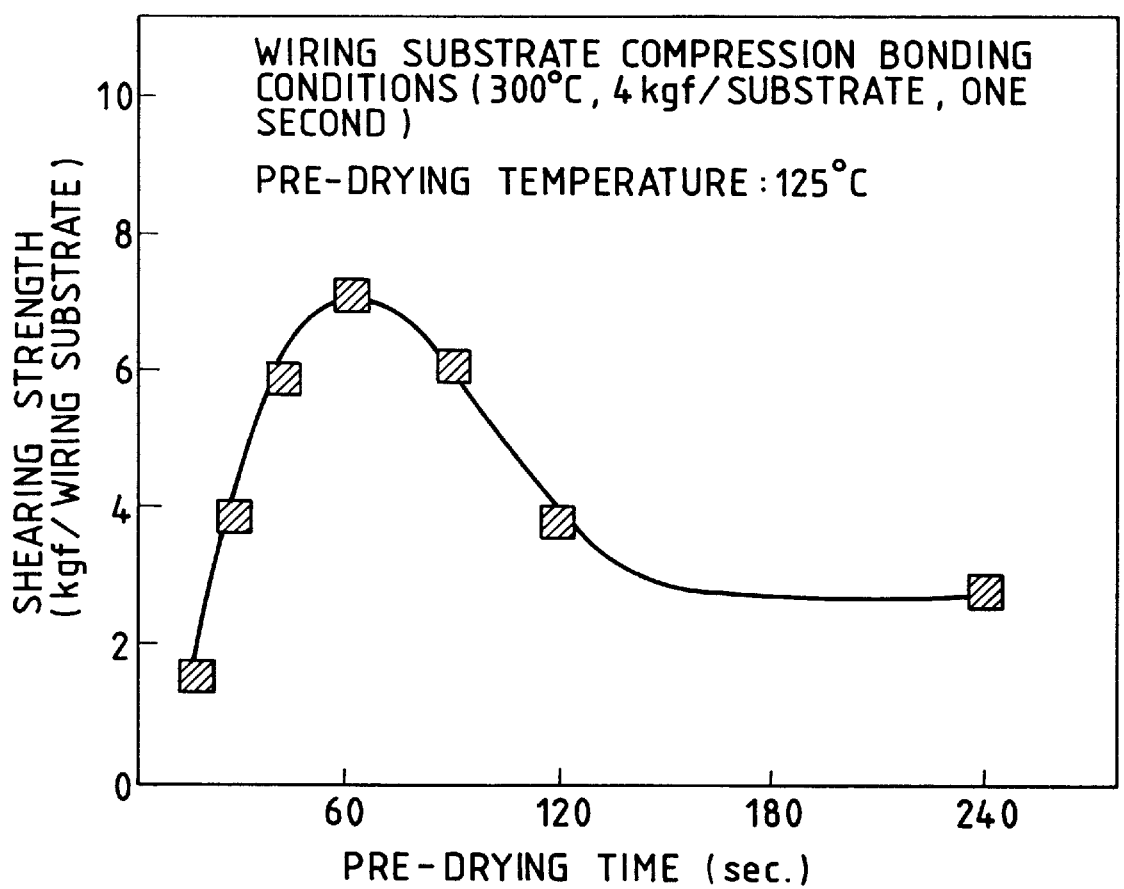
FIG. 7 is a diagram illustrating a relationship between the pre-drying time of the adhesive and the shearing strength of the adhesive layer.

FIG. 7 is a diagram illustrating a relationship between the pre-drying time of the adhesive and the shearing strength of the adhesive layer, wherein the ordinate represents the shearing strength (kgf/wiring substrate, shearing strength per a piece of wiring substrate) of the adhesive layer 16, and the abscissa represents the pre-drying time (seconds) of the adhesive 16a. The diagram of this relationship is found under the following experimental conditions. The pre-drying temperature is set at 125° C. in the step of pre-drying, and the step of thermocompression bonding is effected below 300° C. with a pushing force of [4 kgf/wiring substrate] for about one second. The shearing strength of the adhesive layer 16 is found by measuring the value at the time of shearing of when the support frame 2 which is a sample and the wiring substrate 10 are pushed relative to each other in a transverse direction.

It will be understood from FIG. 7 that the shearing strength of the adhesive layer 16 becomes a maximum when the pre-drying time is 60 seconds. Under a condition in which the drying temperature remains constant (125° C. in this embodiment), it has been known that the amount of vaporization of the solvent in the adhesive varies depending upon the drying time, and the amount of the solvent remaining in the adhesive after drying increases with a decrease in the drying time and decreases with an increase in the drying time. In conducting experiment related to FIG. 7, the amount of the solvent remaining in the adhesive layer 16 when the drying time was 60 seconds, was estimated to be from 0.1% to 10% by weight. It is therefore important that, prior to thermocompression bonding of the portions 6 of the support frame 2 to the wiring substrate 10, the step of pre-drying must be so carried out that the amount of the solvent remaining in the adhesive 16a after the pre-drying is from 0.1% to 10% by weight.

Figure 8:
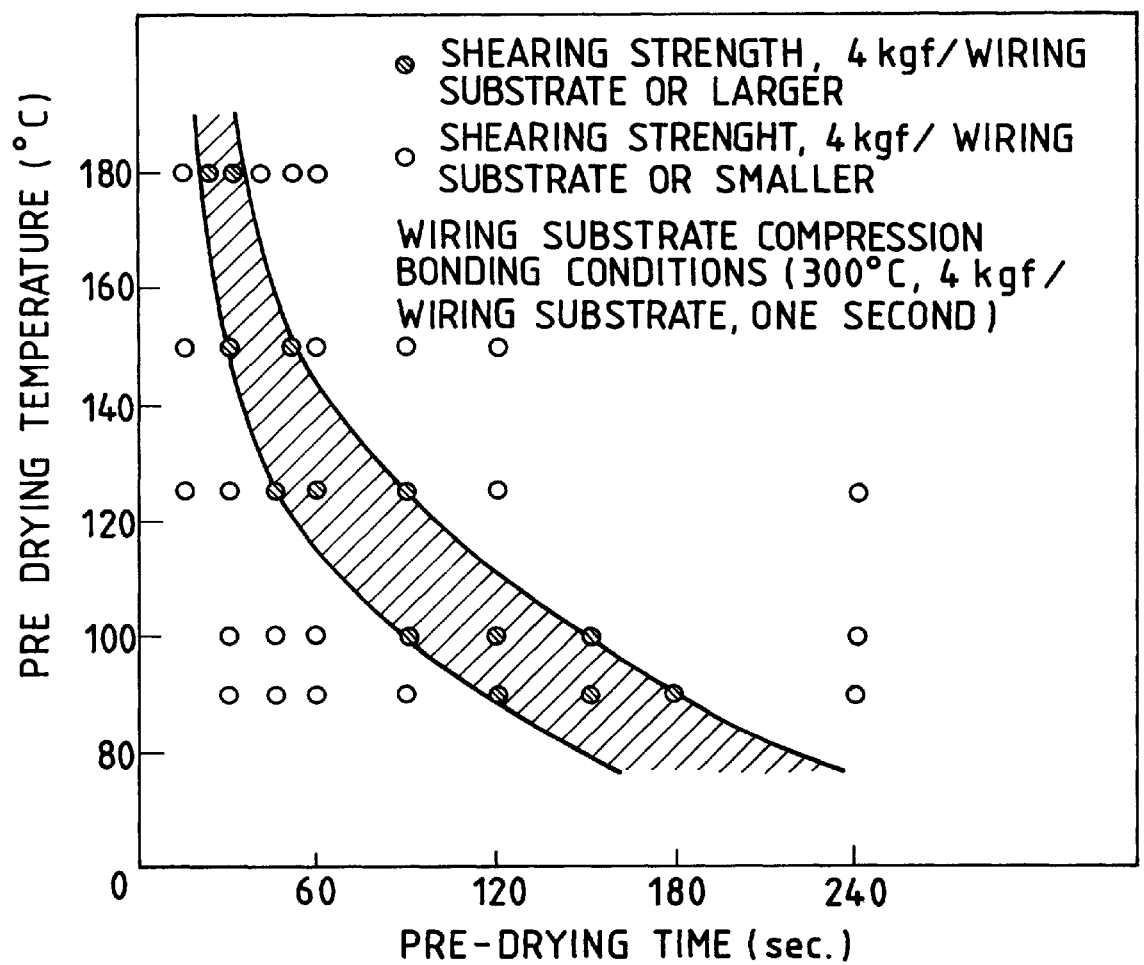
FIG. 8 is a diagram illustrating a relationship among the shearing strength, pre-drying temperature and pre-drying time of the adhesive layer.

FIG. 8 is a diagram illustrating a relationship among the shearing strength of the adhesive layer, pre-drying temperature and pre-drying time, wherein the ordinate represents the pre-drying temperature of the adhesive 16a and the abscissa represents the pre-drying time of the adhesive 16a. The diagram of this relationship was found under the same experimental conditions as those of FIG. 8, and wherein black circles represent the shearing strengths of the samples that are larger than [4 kgf/wiring substrate] and white circles represent the shearing strengths of the samples that are smaller than [4 kgf/wiring substrate].

It will be understood from FIG. 8 that the pre-drying time must be shortened with an increase in the pre-drying temperature, and the pre-drying time must be lengthened with a decrease in the pre-drying temperature. In conducting experiment related to FIG. 8, the amounts of the solvent remaining in the adhesive layer 16 of the samples were estimated. It was found that when the remaining amount of the solvent was from 0.1% to 10% by weight, the shearing strength was not smaller than [4 kgf/wiring substrate]. That is, even by this experiment related to FIG. 8, it was proved that, prior to thermocompression bonding of the portions 6 of the frame 2 to the wiring substrate 10, it is desired to so carry out the step of pre-drying that the amount of the solvent remaining in the adhesive 16a after pre-drying is from 0.1% to 10% by weight.

When the solvent remains in the thermoplastic adhesive 16a in an amount of from 0.1% to 10% by weight, the adhesive layer 16 exhibits good shearing strength on account of the reasons described below. When the adhesive contains the solvent in a small amount, the thermoplastic adhesive must be plasticized by being heated at a high temperature in the step of thermocompression bonding to the wiring substrate, and heating at a high temperature causes discoloration and deformation of the wiring substrate and the support frame. When the thermoplastic adhesive contains the solvent in a large amount, on the other hand, the temperature can be decreased in the step of thermocompression bonding. With the solvent remaining in large amounts in the thermoplastic adhesive layer, however, the adhesive becomes too soft and the adhesive layer loses shearing strength. The thermoplastic adhesive which contains the solvent in a predetermined amount, on the other hand, exhibits suitable viscosity and hardness enabling the bonding to be desirably accomplished and exhibiting good shearing strength.

Figure 9A:
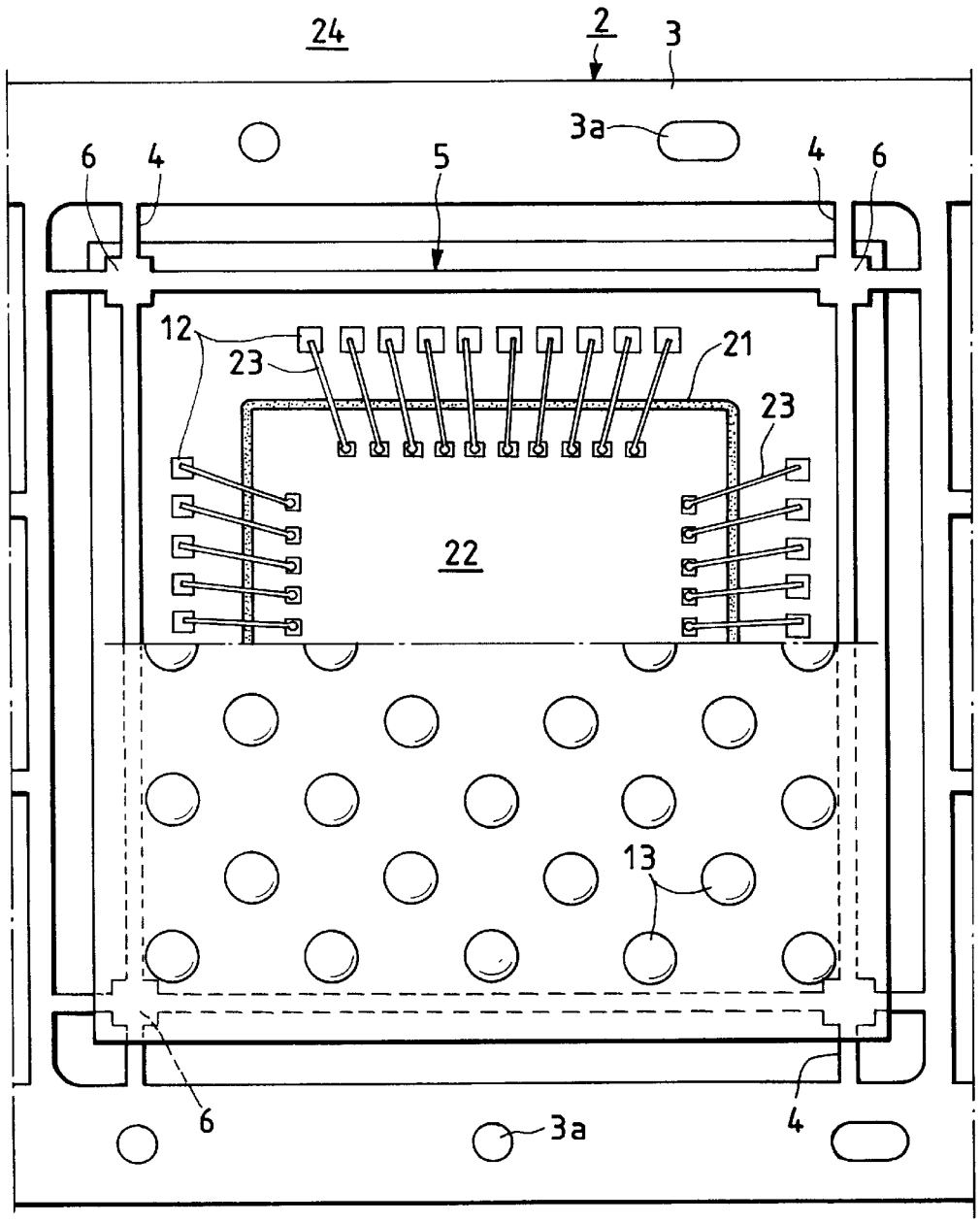
FIG. 9(a) is a diagram of which the upper half side is a plan view thereof and the lower half side is a bottom view thereof.
Figure 9B:
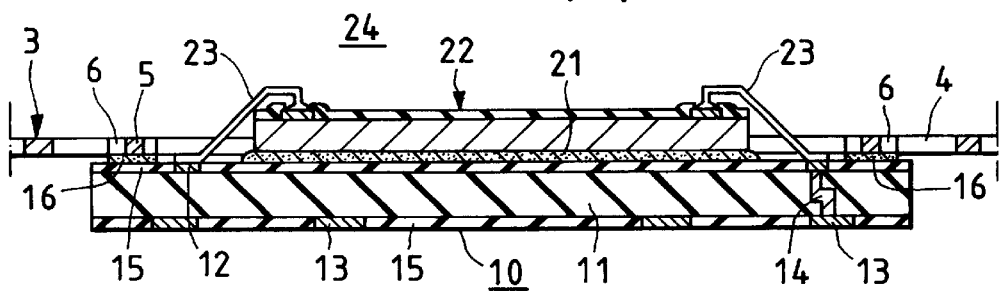
FIG. 9(b) is a partly cut-away front view.

As described above, the combination 20 including the support frame 2 and the wiring substrate 10 has a pellet 22 that is bonded onto the wiring substrate 10 via the bonding layer 21 as shown in FIG. 9 and has wires 23 which are connected across the electrode pads formed along the outer periphery on the upper surface of the pellet 22 and the internal terminals 12 of the wiring substrate 10, that are accomplished through the step of bonding pellet and the step of bonding wires. In this case, since the combinations 20 are constituted in series, the pellet-bonding operation and the wire-bonding operation can be successively accomplished for each of the wiring substrates 10 that are supported by the support frames 2 by intermittently feeding the combinations 20 in the lengthwise direction.

If briefly described, the pellet 22 used for the BGA has an integrated circuit including a group of desired semiconductor elements fabricated in a preceding step which is one of the steps for manufacturing semiconductor devices. The pellet 22 having the integrated circuit (not shown) is diced into a nearly square small piece that can be placed on the center of the wiring substrate 10 and has, along the periphery on one main surface (upper surface) thereof, a plurality of electrode pads formed by using an electrically conducting metal to which the ends of the wires 23 can be bonded.

With the pellet 22 and the wiring substrate 10 being mechanically and electrically connected together through the pellet-bonding operation and wire-bonding operation, there is obtained an assembly 24 of the wiring substrate and the pellet as shown in FIG. 9. The assembly 24 has been incorporated in the combination 20; i.e., the assemblies can be constituted in series.

Figure 10:
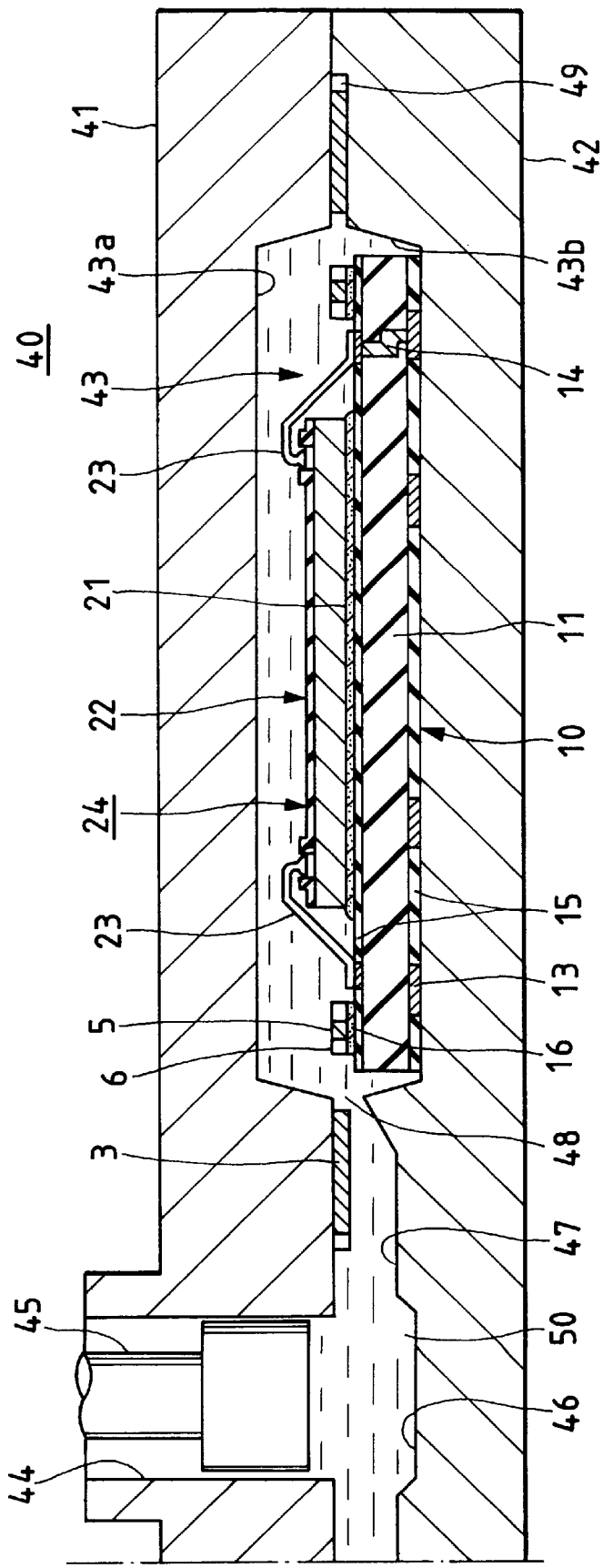
FIG. 10 is a longitudinal sectional view illustrating a step of molding a resin in the manufacturing method.
Figure 11A:
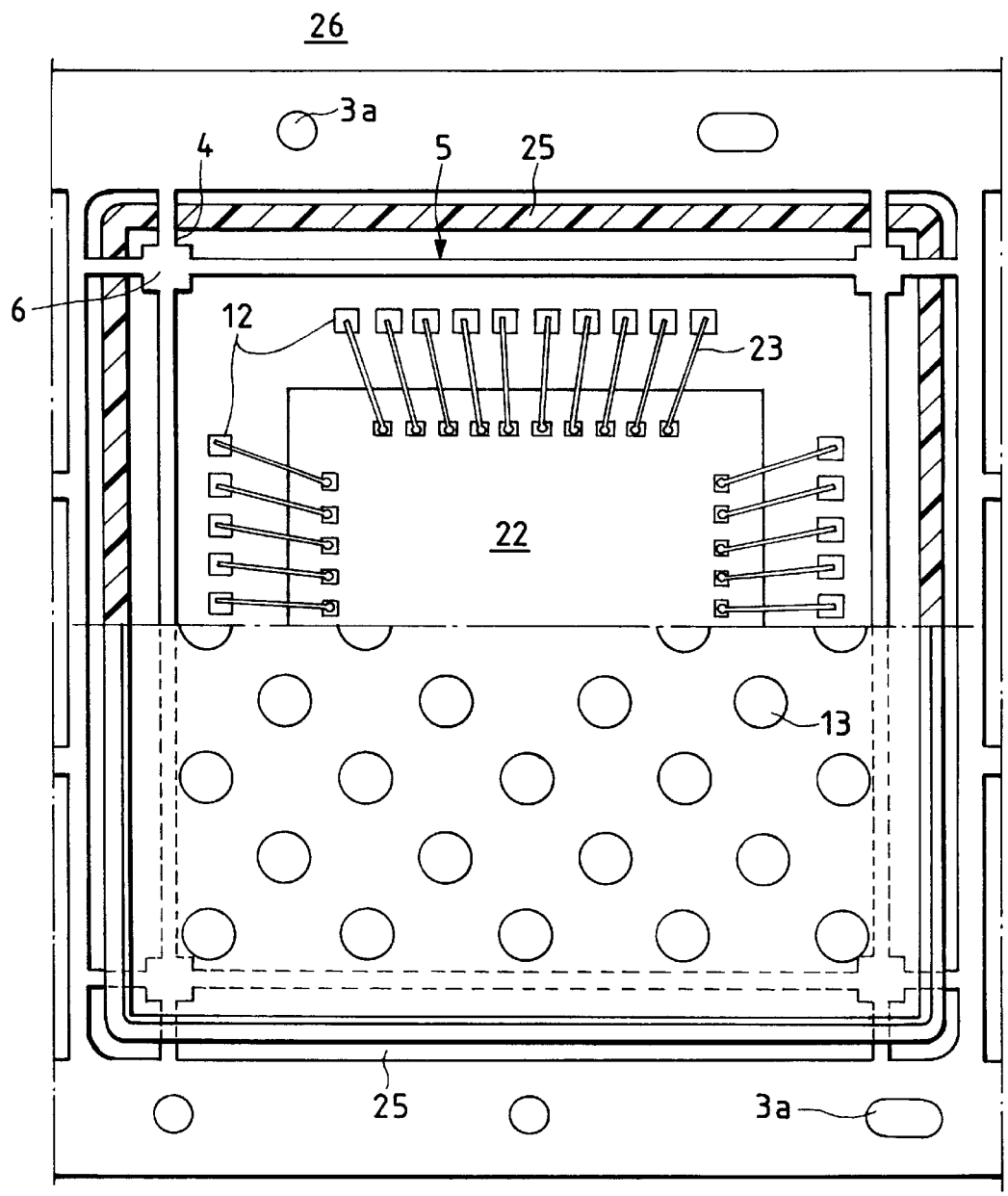
FIG. 11(a) is a diagram of which the upper half side is a sectional plan view thereof and the lower half side is a bottom view thereof.
Figure 11B:
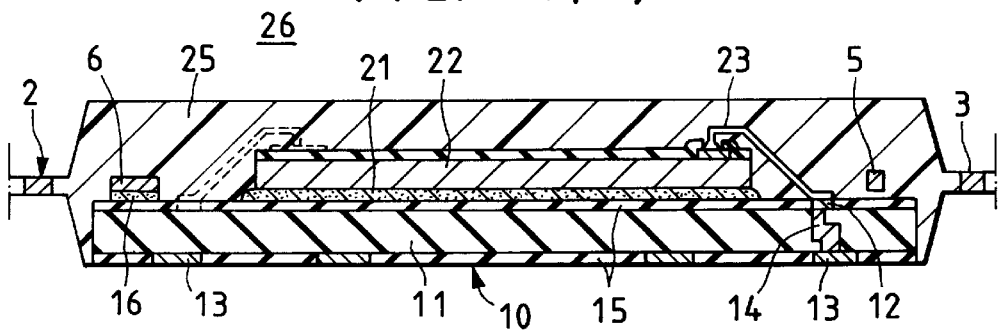
FIG. 11(b) is a partly cut-away front view.

Next, each of a series of assemblies 24 is molded with the resin 25 as shown in FIG. 11 by using a transfer molding machine 40 that is shown in FIG. 10.

The transfer molding machine 40 shown in FIG. 10 is equipped with a pair of upper mold 41 and lower mold 42 that are tightened against each other by a cylinder (not shown). In the contacting surfaces of the upper mold 41 and the lower mold 42 are formed upper cavities 43a and lower cavities 43b which work together to form a plurality of cavities 43 (only one cavity is shown). A pot 44 is formed in the contacting surface of the upper mold 41, and a plunger 45 that is advanced and retracted by a cylinder (not shown) is inserted in the pot 44 so as to feed a resin which is a molding material. In the contacting surface of the lower mold 42 is formed a cull 46 at a position opposed to the pot 44, and a plurality of runners 47 are radially formed so as to be connected to the port 44. The other ends of the runners 47 are connected to the lower cavity 43b, and at the bonding portions thereof are formed gates 48 so that the resin can be injected into the cavity 43. In the contacting surface of the lower mold 42 is further formed an escape recess 49 in a rectangular form which is slightly larger than the outer size of the series of support frames 1 maintaining a depth nearly equal to the thickness of the support frames 1 enabling the thickness of the series of support frames 1 to escape.

During the transfer molding, the series of assemblies are contained in the escape recesses 49 formed in the lower mold 42. Then, the inner peripheral edge of the outer frame 3 of the support frame 2 is oriented along the outer peripheral edge of the lower cavity 43b to thereby constitute a dam. The wiring substrate 10, anchor 5 and pellet 22 are then contained in the lower cavity 43b. The lower surface of the wiring substrate 10 comes into contact with the bottom surface of the lower cavity 43b.

Next, the upper mold 41 and the lower mold 42 are tightened against each other, and the support frame 2 is sandwiched between the upper mold 41 and the lower mold 42. Then, the resin 50 is supplied and is forcibly introduced into the cavities 43 from the pot 44 due to the plunger 45 via runners 47 and gates 48.

After introduction, the resin is thermally cured so as to be molded as designated at 25. Then, the upper mold 41 and the lower mold 42 are split from each other, and a group of resin molds 25 are taken out by ejector pins (not shown).

Through the above-mentioned step of transfer molding, a molded article 26 shown in FIG. 11 is obtained. In FIG. 11, the resin mold 25 seals therein the pellet 22, group of internal terminals 12, group of wires 23, bonding portions 6 of the anchor 5, and a portion of the wiring substrate 10. In this state, the pellet-mounting surface of the base 11 of the wiring substrate 10 and the end surface of the opposite side are exposed from the lower surface of the resin mold 25, and the group of external terminals 13 are exposed.

Thereafter, solder bumps 27 are formed on the group of external terminals 13 exposed on the lower surface of the base 11 of the wiring substrate 10 by a suitable method (not shown) such as reflow soldering method, screen printing method or metal mask vaporization method. Hanging members 4 of the support frame 2 are cut at the base ends of the resin mold 25 and, thus, the BGA constituted as shown in FIG. 1 is manufactured.

The BGA thus manufactured is electrically and mechanically connected by forming the solder bumps 27 on the printed wiring substrate (hereinafter referred to as mounting board) by the reflow soldering method in match with the pads of the mounting board. When the BGA thus mounted is operated, the pellet 22 produces heat which, however, is directly conducted to the mounting board from the pellet 22 through the wiring substrate and is radiated to the external area from the wide surface area of the resin mold 25. Therefore, the pellet 22 is cooled to a sufficient degree.

The BGA is finally inspected before shipment. As the final inspection, environmental testing is conducted inclusive of temperature cycle testing and thermal shock testing. As described above, furthermore, when the BGA is mounted on the mounting board, the BGA is heated by the reflow soldering. When operated, furthermore, the BGA is subjected to the repetition of heating and cooling. When the thermal stress is exerted accompanying the environmental testing, mounting operation and operation of the device, the water contained in the resin mold and in the wiring substrate vaporizes during the step of preservation after the resin mold is completed or during the environmental testing, resulting in the occurrence of stress in an interface between the wiring substrate inside the resin mold and the resin mold, in an interface between the pellet and the resin mold, in an interface between the pellet and the wiring substrate and in an interface between the anchor and the wiring substrate. When the thermal stress is exerted accompanying the environmental testing, mounting operation and operation of the device, furthermore, stress occurs in the resin mold due to a difference in the coefficient of thermal expansion among the constituent materials. Due to the stress caused by the difference in the coefficient of thermal expansion and the stress caused by the vaporization of water contained in the resin mold and in the wiring substrate, gaps occur in the interface between the wiring substrate and the resin mold, in the interface between the pellet and the resin mold, in the interface between the pellet and the wiring substrate and in the interface between the anchor and the wiring substrate. Occurrence of gaps does not become a cause of cracks that may impair the resin mold or the wiring substrate.

When the BGA is subjected to the reflow soldering in a state where much water is contained in the resin mold or in the wiring substrate, however, it was found by the present inventors that peeling occurs in the interface (near the bonding portion) between the wiring substrate 10 and the resin mold 25 near the bonding portions 6 of the anchor 5 for supporting the wiring substrate 10 by the support frame 2, and cracks develop in the wiring substrate 10 starting from the bonding portions 6. It was further discovered by the present inventors that when the bonding portions 6 have small areas, peeling does not occur in the interface relative to the wiring substrate 10 near the bonding portions despite water is contained in relatively large amounts in the resin mold and in the wiring substrate, and no crack develops starting from the bonding portions 6. With the BGA of the above-mentioned embodiment in which each bonding portion 6 has an area as small as 1.4 mm$^2$, no peeling takes place in the interface near the bonding portions even when the BGA 28 is subjected to the reflow soldering within a humidifying time that is specified for maintaining the reliability of ordinary resin-molded packages, and no crack develops in the wiring substrate 10.

Table 1 shows experimental data for finding a relationship between the size of the bonding portion and the peeling in the interface near the bonding portion, i.e., shows data related to the number of peelings that took place in the interface near the bonding portions and to the number of occurrence/total number of when a sample A having bonding portion of an area of about 3.1 mm$^2$ (2 mm in diameter), a sample B having bonding portion of an area of about 2.2 mm$^2$ (1.5 mm in diameter), a sample C. having bonding portion of an area of about 1.4 mm$^2$ (1.2 mm in diameter) and a sample D having bonding portion of an area of about 0.8 mm$^2$ (0.9 mm in diameter) are moistened under the humidifying conditions of a temperature of 30° C. and a relative humidity (RH) of 85%, and are heated in an infrared reflow furnace at a maximum temperature of not higher than 245° C. but not lower than 240° C. for 10 seconds.

TABLE 1

| Humidifying time | Sample A | Sample B | Sample C | Sample D |
| --- | --- | --- | --- | --- |
| 72 Hrs. | 0/5 | 0/5 | 0/5 | 0/5 |
| 168 Hrs. | 0/5 | 0/5 | 0/5 | 0/5 |
| 336 Hrs. | 2/5 | 0/5 | 0/5 | 0/5 |
| 500 Hrs. | — | 1/5 | 0/5 | 0/5 |

It will be understood from Table 1 that when the bonding portion 6 has a small area, occurrence of peeling in the interface near the bonding portion is prevented despite an increase in the humidifying time. In other words, the BGA exhibits improved reliability with a decrease in the bonding portion 6. This is attributed to the fact that the smaller the bonding portion 6, the smaller the stress that is caused by the thermal stress. Usually, the humidifying time is 168 hours (one week) for maintaining the reliability of the resin-molded package. From Table 1, therefore, it is desired that the bonding portion 6 has an area of not larger than 3.1 mm$^2$ and, more preferably, not larger than 1.4 mm$^2$.

Figure 12:
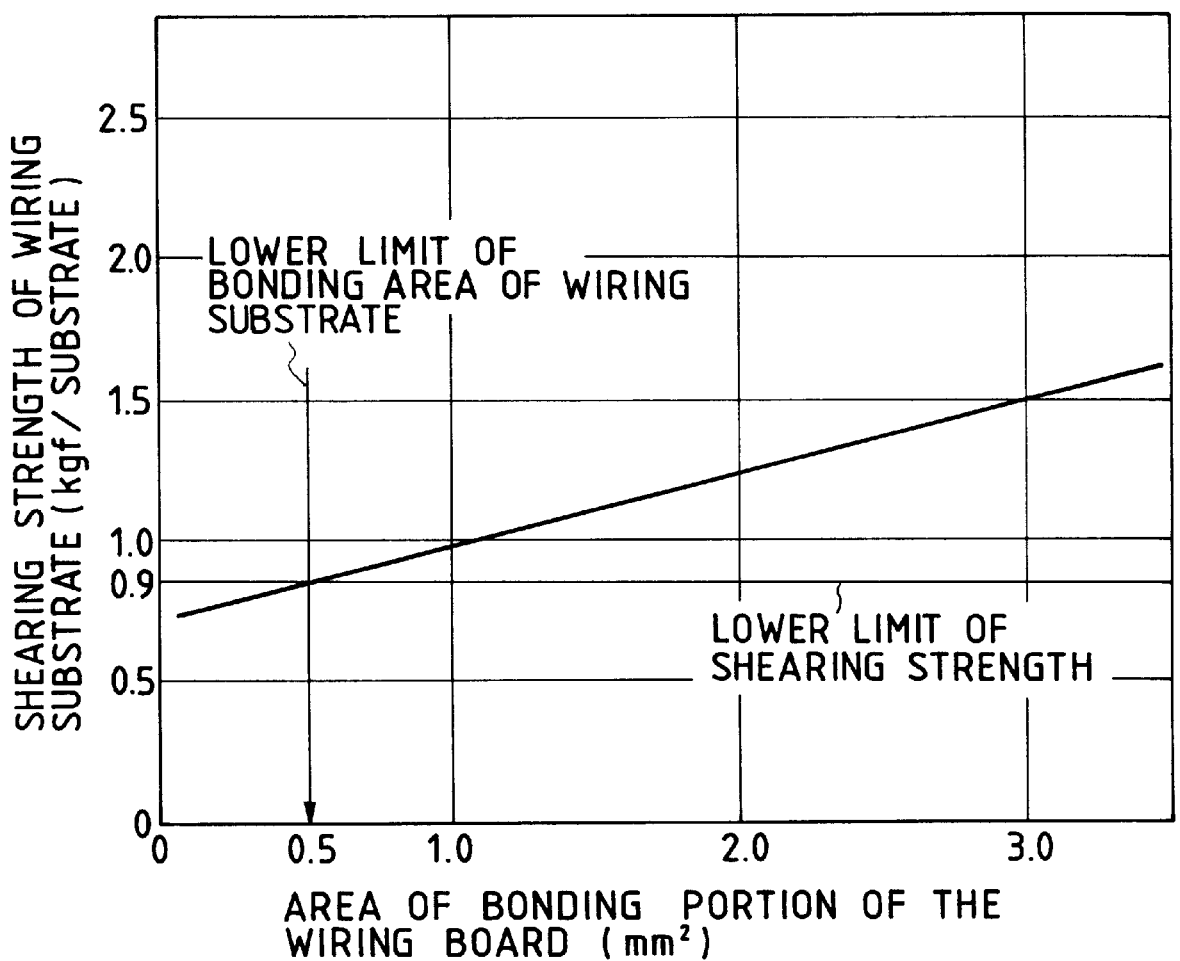
FIG. 12 is a diagram illustrating a relationship between the shearing strength of the adhesive layer and the area of the bonding portion.

FIG. 12 is a diagram illustrating a relationship between the shearing strength of the adhesive layer and the area of the bonding portion, wherein the ordinate represents the shearing strength (kgf/wiring substrate, shearing strength per a piece of wiring substrate) of the adhesive layer 16 and the abscissa represents the area of the bonding portion. The diagram of this relationship is found under the following experimental conditions. In the step of pre-drying, the pre-drying temperature is set at 125° C. and the step of thermocompression bonding is effected at a temperature of not higher than 300° C. under a pushing force of 4 kgf/wiring substrate for about one second. The shearing strength of the adhesive layer 16 is found by measuring the value at the time of shearing of when the support frame 2 and the wiring substrate 10 are pushed relative to each other in a transverse direction.

It will be understood from FIG. 12, that the shearing strength of the adhesive layer 16 decreases with a decrease in the area of the bonding portion 6. When the area of the bonding portion 6 is too decreased from the standpoint of preventing the peeling in the interface near the bonding portion, therefore, the shearing strength of the adhesive layer 16 becomes too small. When the shearing strength of the adhesive layer 16 is too small, it becomes difficult to transfer the combination 20 of the support frame 2 and the wiring substrate 10 and the assembly 24 after the pellet-bonding and wire-bonding operations. Besides, it becomes difficult to execute the pellet-bonding operation and the wire-bonding operation, too. This further impairs the operation for positioning the wiring substrate 10 by the support frame 2 during the transfer molding. In order to properly carry out these operations and to maintain positioning precision, therefore, a minimum shearing strength of the adhesive layer 16 is selected to be 0.9 kgf/wiring substrate and the area of the bonding portion 6 is selected to be not smaller than 0.5 mm$^2$ from FIG. 12.

According to the above-mentioned embodiment, the following effects are obtained.

In the BGA in which the bonding portions 6 of the support frame 2 adhered via adhesive layer 16 to the wiring substrate 10 are molded in the resin 25, the areas of the bonding portions 6 are each selected to be 1.4 mm$^2$. This makes it possible to prevent the occurrence of peeling in the interface near the bonding portions even when the BGA is subjected to the reflow soldering within the humidifying time that is usually specified for maintaining reliability of the resin-molded packages and, hence, to prevent the occurrence of cracks in the wiring substrate 10.

In bonding the support frame 2 onto the wiring substrate 10, a thermoplastic adhesive 16a having a glass transition temperature of not lower than 200° C. and the viscosity of $10^4$ to $10^5$ poises at 350° C. is applied to the bonding portions 6, pre-drying is so effected that the amount of the solvent remaining in the adhesive after pre-drying is from 0.1% to 10% on the weight basis, and the bonding portions 6 are put onto the wiring substrate 10 via the adhesive 16a at a temperature of not higher than 300° C. for not longer than 3 seconds, so that the support frame 2 is bonded onto the wiring substrate 10 maintaining a shearing strength larger than a predetermined value while preventing the discoloration or deformation of the wiring substrate 10 and the support frame 2. Thus, the support frame 2 and the wiring substrate 10 are easily joined together, and are reliably prevented from separating or from moving relative to each other.

A series of support frames 1 are prepared, in which are serially connected a number of unit support frames 2 with the bonding portions 6 hanging on the outer frame 3, and the wiring substrates 10 are mounted onto the unit support frames 2 of the series of support frames 1. This eliminates the need for constituting a series of costly wiring substrates, and makes it possible to lower the manufacturing cost since the material yield of the wiring substrates can be decreased.

With the wiring substrates being mounted on the unit support frames of the series of support frames, furthermore, it is allowed to handle a number of intermediate products at one time during the assembling steps, making it possible to suppress an increase in the manufacturing cost despite of using the separate wiring substrates.

Figure 13A:
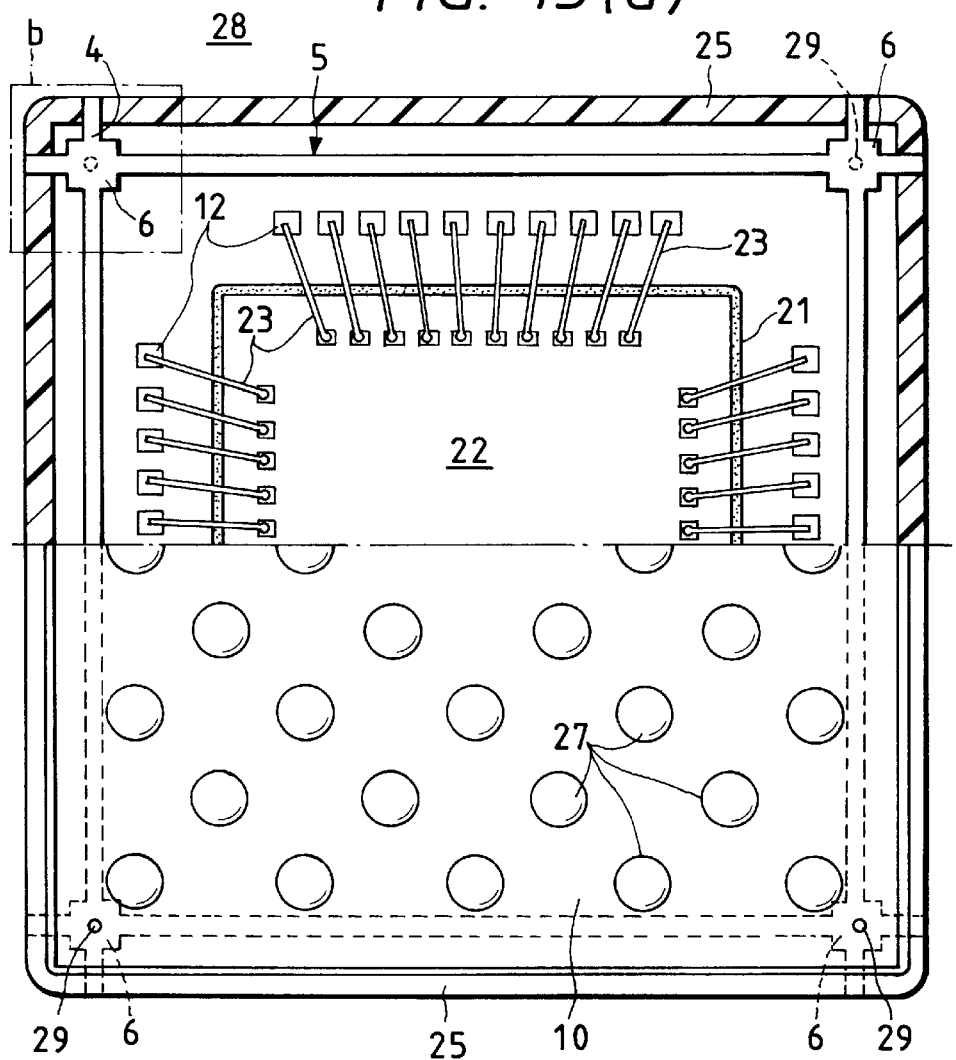
FIG. 13(a) is a diagram of which the upper half side is a sectional plan view thereof and the lower half side is a bottom view thereof.
Figure 13B:
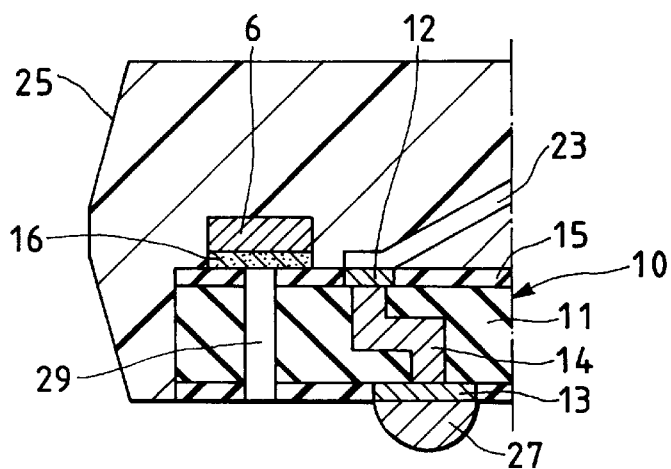
FIG. 13(b) is a sectional view illustrating a portion b of FIG. 13(a) on an enlarged scale.

FIG. 13 illustrates the BGA according to a second embodiment of the present invention, wherein FIG. 13(a) is a diagram of which the upper half side is a sectional plan view and the lower half side is a bottom view, and FIG. 13(b) is a sectional view illustrating the portion b of FIG. 13(a) on an enlarged scale.

What makes the second embodiment different from the first embodiment is that vent holes 29 are formed at four corners of the wiring substrate 10 to communicate the upper surface to the lower surface and are opposed to the bonding portions 6. The vent holes 29 may be mechanically formed in the wiring substrate 10 by a method such as perforation by drilling or may be chemically formed in the wiring substrate 10 by lithography processing or etching processing.

According to the second embodiment, a gas emitted from the adhesive layer 16 can be released to the external side via vent holes 29 at the time when the bonding portions 6 of the anchor 5 of the support frame 2 are bonded to the wiring substrate 10 via adhesive layer 16 by thermocompression.

In the foregoing was concretely described the invention accomplished by the present inventors by way of embodiments. The invention, however, is in no way limited to the above-mentioned embodiments only but can be modified in a variety of ways without departing from the gist and scope of the invention.

For instance, the anchor 5 is not limited to the shape of a square frame but may be constituted by hanging members 4 and bonding portions 6 for coupling to the outer frame 3 of the support frame 2.

The wiring substrate may be mounted onto the unit support frame in a series of support frames after the pellet and wires have been bonded to the wiring substrate.

The electric connection between the wiring substrate and the pellet can be accomplished not only by the wire bonding method but also by a bonding (gang bonding) method for effecting the bonding at one time, such as flip chip bonding or tape automated bonding (TAB) method.

The external terminals of the wiring substrate may be provided with pins in addition to solder bumps.

The resin mold and the wiring substrate are not limited to a square shape only but may be a quadrilateral such as rectangular shape or the like shape.

The foregoing description has dealt with the case where the invention accomplished by the present inventors was applied to the BGA in a field that served as the background of the invention. The invention, however, is in no way limited thereto only but can be further applied to those in which external terminals are arranged on the whole surface of the package, such as plastic pin grid array package (P-PGA), etc., power transistors and other electronic devices in general. In particular, the invention exhibits excellent effects when it is applied to semiconductor devices that are small in size, light in weight, have many pins and are desired to be produced at low costs.

Briefly described below are the effects obtained by a representative example of the invention disclosed in this application.

In the semiconductor device in which the bonding portions of the support frame attached to the adhesive layer on the wiring substrate are molded in the resin, the areas of the bonding portions are each selected to be not larger than 3.1 mm$^2$. This makes it possible to prevent the occurrence of peeling in the interface near the bonding portions even when the semiconductor device is subjected to the reflow soldering within the humidifying time that is usually specified for maintaining reliability of the resin-molded packages and, hence, to prevent the occurrence of cracks in the wiring substrate starting from the bonding portions.

In adhering the support frame onto the wiring substrate, a thermoplastic adhesive having a glass transition temperature of not lower than 200° C. and a viscosity of $10^4$ to $10^5$ poises at 350° C. is applied to the bonding portions, pre-drying is so effected that the amount of the solvent remaining in the adhesive after pre-drying is from 0.1% to 10% by weight, and the bonding portions are put onto the wiring substrate via the adhesive at a temperature of not higher than 300° C. for not longer than 3 seconds, so that the support frame is bonded onto the wiring substrate maintaining a shearing strength larger than a predetermined value while preventing the discoloration or deformation of the wiring substrate and the support frame. Owing to this simple bonding method, the support frame and the wiring substrate are reliably prevented from separating or from moving relative to each other.

What is claimed is:

1. A method of manufacturing a semiconductor device comprising the steps of:

preparing a substrate obtained by impregnating a glass fiber with an epoxy resin, having an upper surface and a rear surface opposing said upper surface, said substrate including first electrodes formed on said upper surface and second electrodes formed on said rear surface, said first and second electrodes being electrically connected with each other;

mounting a semiconductor pellet on said upper surface of substrate, said semiconductor pellet having external terminals formed on a main surface of said pellet, said external terminals being electrically connected with said first electrodes;

forming a plurality of bump electrodes on said rear surface of substrate, said bump electrodes being electrically connected with said second electrodes;

attaching a frame member for supporting said substrate to said upper surface of said substrate by a thermoplastic resin adhesive; and sealing said semiconductor pellet and said upper surface of said substrate by a resin molding, wherein the step of attaching said frame member to said substrate includes a first sub-step of subjecting said thermoplastic resin adhesive to a first thermal treatment to control an amount of solvent remaining in said thermoplastic resin adhesive and, after the first substep, a second sub-step of subjecting said thermoplastic resin adhesive to a second thermal treatment to bond said frame member to said upper surface of said substrate by using said thermoplastic resin adhesive, said second thermal treatment is performed at a temperature below 300° C.; and further comprising the step of forming vent holes in the substrate to permit gas emitted from the thermoplastic resin adhesive to be released during the step of attaching the frame member to the substrate.

2. A method of manufacturing a semiconductor device comprising the steps of:

(a) preparing a substrate and a frame member for supporting said substrate, said substrate being obtained by impregnating a glass fiber with an epoxy resin and having an upper surface and a rear surface opposing said upper surface, said substrate including first electrodes formed on said upper surface and second electrodes formed on said rear surface, said first and second electrodes being electrically connected with each other;

(b) applying a thermoplastic resin adhesive to said frame member;

(c) subjecting said frame member with said thermoplastic resin adhesive to a first thermal treatment;

(d) after the steps (b) and (c), attaching said frame member to said upper surface of said substrate and subjecting said thermoplastic resin adhesive to a second thermal treatment, thereby to bond said frame member to said upper surface of said substrate by using said thermoplastic resin adhesive;

(e) mounting a semiconductor pellet on said upper surface of substrate, said semiconductor pellet having external terminals being electrically connected with said first electrodes;

(f) sealing said semiconductor pellet and said upper surface of said substrate by a resin molding; and (g) forming a plurality of bump electrodes on said rear surface of substrate, said bump electrodes being electrically connected with said second electrodes, said second thermal treatment is performed at a temperature below 300° C. substrate; and further comprising the step of forming vent holes in the substrate to permit gas emitted from the thermoplastic resin adhesive to be released during the step of attaching the frame member to the substrate.

3. A method of manufacturing a semiconductor device including attaching a frame member to a resin substrate, the method comprising the steps of:

providing a thermoplastic resin adhesive on the frame member at locations;

performing a first thermal treatment step to control a solvent remaining in said thermoplastic resin adhesive;

attaching the frame member to the resin substrate by subjecting the thermoplastic resin adhesive to a second thermal treatment step; and forming vent holes in the substrate to permit release of gas emitted from the thermoplastic resin adhesive during the step of attaching the frame member to the resin substrate.

4. A method of manufacturing a semiconductor device comprising the steps of:

preparing a substrate obtained by impregnating a glass fiber with an epoxy resin, having an upper surface and a rear surface opposing said upper surface, said substrate including first electrodes formed on said upper surface and second electrodes formed on said rear surface, said first and second electrodes being electrically connected with each other;

mounting a semiconductor pellet on said upper surface of said substrate, said semiconductor pellet having external terminals;

electrically connecting said first electrodes of said substrate to said external terminals of said semiconductor pellet;

attaching a frame member for supporting said substrate to said upper surface of said substrate by a thermoplastic resin adhesive; and sealing said semiconductor pellet and said upper surface of said substrate by a resin molding, said resin molding covering said upper surface of said substrate including a part where said frame member is attached;

wherein the step of attaching said frame member to said substrate includes a first sub-step of subjecting a first thermal treatment to said thermoplastic resin adhesive to control the remaining amount of solvent in said thermoplastic resin adhesive and after the first sub-step, a second sub-step of subjecting a second thermal treatment to said thermoplastic resin adhesive to bond said frame member to said upper surface of said substrate by said thermoplastic resin adhesive; and wherein said second thermal treatment is performed at a temperature below 300° C.

5. A method of manufacturing a semiconductor device according to claim 3, further comprising the step of forming a plurality of bump electrodes on said rear surface of substrate so as to electrically connect with said second electrodes of said substrate.

6. A method of manufacturing a semiconductor device comprising the steps of:

preparing a substrate obtained by impregnating a glass fiber with an epoxy resin, having an upper surface and a rear surface opposing said upper surface, said substrate including first electrodes formed on said upper surface and second electrodes formed on said rear surface, said first and second electrodes being electrically connected with each other and vent holes penetrating from said upper surface to said rear surface;

mounting a semiconductor pellet on said upper surface of said substrate, said semiconductor pellet having external terminals;

electrically connecting said first electrodes of said substrate to said external terminals of said semiconductor pellet;

attaching a frame member for supporting said substrate to said upper surface of said substrate by a thermoplastic resin adhesive, said frame member being attached at said vent holes of said substrate; and sealing said semiconductor pellet and said upper surface of said substrate by a resin molding, said resin molding covering said upper surface of said substrate including parts where said vent holes are formed.

* * * * *